United States Patent [19]

Robinette, Jr.

[11] 3,860,461

[45] Jan. 14, 1975

[54] METHOD FOR FABRICATING SEMICONDUCTOR DEVICES UTILIZING COMPOSITE MASKING

[75] Inventor: William C. Robinette, Jr., Rosenberg, Tex.

[73] Assignee: Texas Instruments Incorporated, Dallas, Tex.

[22] Filed: May 29, 1973

[21] Appl. No.: 364,981

[52] U.S. Cl. .................... 148/187, 148/190, 357/48
[51] Int. Cl. .............................................. H01l 7/44
[58] Field of Search ............................ 148/187, 190

[56] References Cited

FOREIGN PATENTS OR APPLICATIONS 1,159,637 7/1969 Great Britain ..................... 148/187

OTHER PUBLICATIONS

Dhaka et al., "Masking Technique," IBM Tech. Discl. Bull., Vol. 11, No. 7, Dec. 1968, pp. 864, 865.

*Primary Examiner*—C. Lovell
*Attorney, Agent, or Firm*—Harold Levine; James T. Comfort; Gary C. Honeycutt

[57] ABSTRACT

An improved method for selectively masking a substrate surface is disclosed. The method includes forming a first layer of a masking material on a substrate and patterning this layer to provide a plurality of accurately spaced apertures exposing corresponding spaced locations on the substrate surface. A second composite masking layer is formed over the structure and is patterned to provide a plurality of apertures exposing a first set of apertures in the first layer, thereby enabling modification of the characteristics of the set of substrate surface locations exposed through the corresponding apertures through the first and second layers. A third composite masking layer is then formed over the structure and patterned to expose a second set of apertures in the first layer, thereby enabling modification of the characteristics of a second set of substrate locations, while maintaining accurate spacing between substrate location.

8 Claims, 10 Drawing Figures

METHOD FOR FABRICATING SEMICONDUCTOR DEVICES UTILIZING COMPOSITE MASKING

Figure 1:
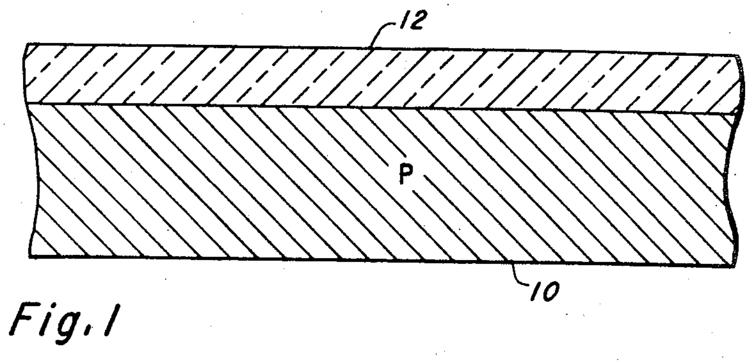
Figure 2:
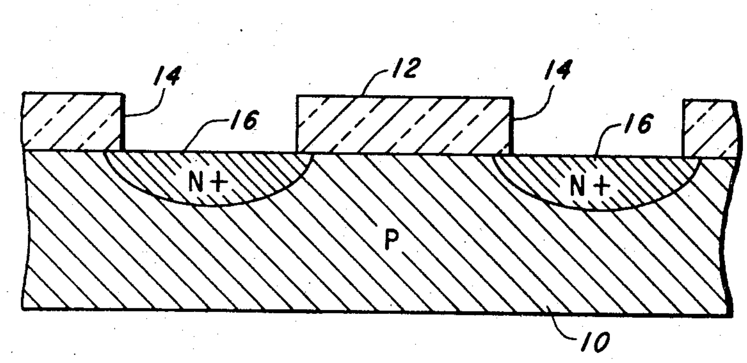

The present invention relates generally to methods for selectively masking a substrate surface, and more particularly to an improved method for forming a composite diffusion mask in the fabrication of a semiconductor device.

In integrated circuit processing and circuit design it is advantageous to make device geometries as small as possible to increase the packing density. A major limitation on decreasing device geometries is imposed by mask alignment. That is, in the fabrication of semiconductor devices, such as integrated circuits, it is necessary to selectively dope the semiconductor material with impurities to vary the conductivity type or resistivity thereof, in order to form the various devices. Typically, the semiconductor substrate is selectively doped by employing a number of sequential diffusion steps. In this method a series of masks are utilized for defining the areas on the surface of the semiconductor body to be subjected to the diffusion procedure. Conventional photolithographic operations required for defining the mask patterns require critical alignment between adjacent regions on the surface of the semiconductor body to allow for mask misalignment, incorrect aperture size, overetching during removal procedures, etc. The spacing between various apertures in the masks becomes extremely critical as the complexity of the device being fabricated increases, since it is desirable to provide a large number of circuit elements in a relatively small area on the semiconductor body. Consequently, high packing density in which a large number of circuit elements are formed in a limited area becomes difficult to achieve. Although various proposals have been attempted for utilizing thinner masks in order to improve resolution, such attempts have generally met with failure since sequential mask registrations still remain a problem, and since a thin mask may fail to adequately protect the underlying surface regions.

Another proposal for selectively masking a silicon semiconductor surface utilizes a silicon nitride layer as an etch mask for an underlying silicon dioxide layer. The silicon nitride is patterned and etched to expose underlying portions of the silicon dioxide layer. The silicon nitride etch does not substantially etch any of the silicon dioxide. A silicon dioxide etch is then used to remove the exposed silicon dioxide down to the silicon substrate. Several problems are encountered in this technique. First, the silicon nitride is undercut at each silicon dioxide removal and diffusion deglaze operation, making subsequent interconnect metallization more difficult. Also, since the outer surface of the silicon nitride converts to silicon dioxide, it is difficult to remove all of the silicon nitride subsequent to the diffusion steps. Secondly, windows opened in the silicon nitride enlarge due to the underlying oxide being undercut; this is particularly a problem when more than one etch is required since it results in the spacings between diffusions being reduced. This can result in lower reliability, different circuit parameters, etc. Thirdly, oxidation takes place in all diffusion regions, i.e., those regions not covered by silicon nitride, at each step in the process. This results in more pronounced oxide steps and makes metallization more difficult.

Accordingly, it is an object of the present invention to provide high resolution thin-film masking techniques for use in fabricating microminiature devices.

It is another object of the present invention to provide a process in which a single composite mask is provided having a plurality of accurately-spaced sets of areas defined therein with an improved degree of resolution, thereby reducing the number of critical alignment steps normally required in a multiple-mask processing sequence.

It is a further object of the present invention to provide a more efficient process for fabricating semiconductor devices having a substantially increased packing density of circuit elements.

Briefly, in accordance with one aspect of the invention, a method for fabricating a semiconductor device is provided. The method includes patterning an adherent thin-film mask on a substrate surface to provide a mask having a plurality of accurately-spaced sets of apertures. A second adherent thin-film mask is then placed over the first mask. The second mask is patterned to selectively expose only one set of apertures in the first mask. The substrate locations thereby exposed are doped with impurities. Subsequently, a third adherent thin-film mask is patterned on the composite structure, to selectively expose only a second set of apertures in the first mask, and thereby permit a second desired operation to be carried out to modify the re-exposed substrate location. It will be recognized that each set of apertures in the first mask could readily have been patterned in a separate mask, thereby permitting the use of only two masks instead of three; but such a procedure would not permit a sufficiently accurate spacing of the second aperture set with respect to the first aperture set, as desired in accordance with the invention, because of the inherent limitations upon the accuracy with which a second mask can be aligned with respect to a first mask positioned on a given substrate.

Figure 7:
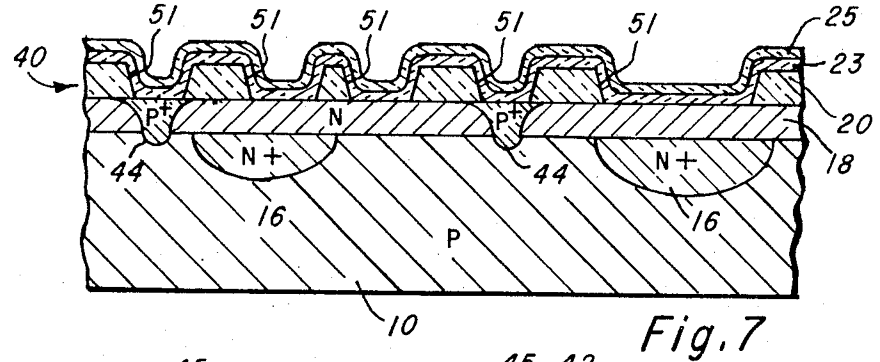
Figure 8:
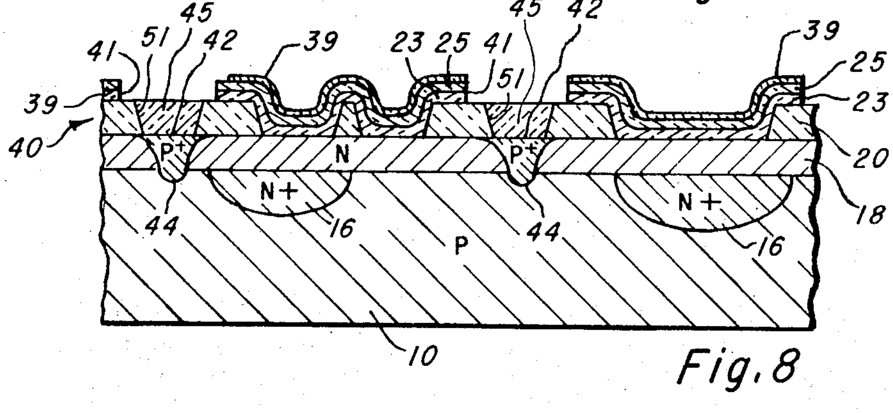
Figure 9:
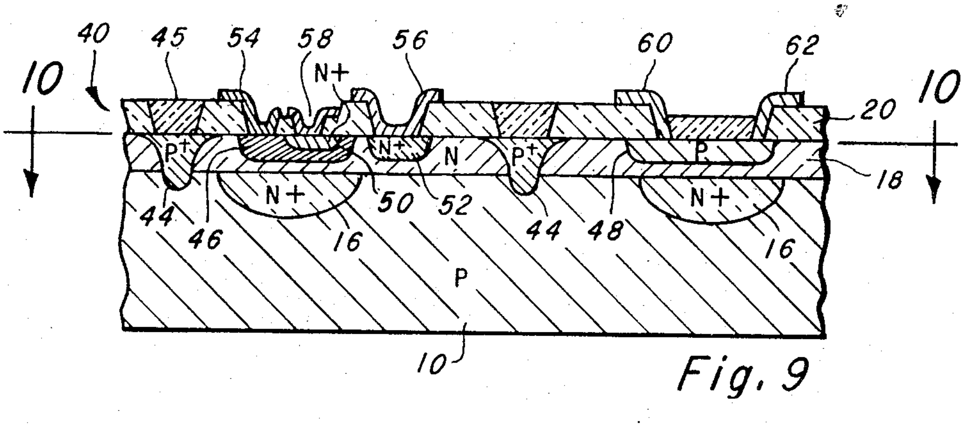
Figure 10:
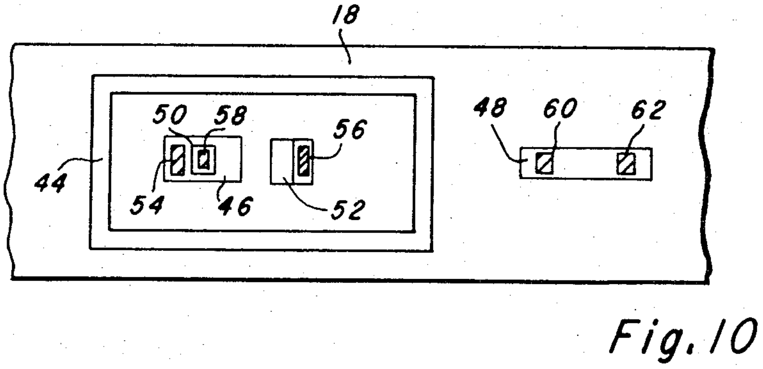

Various additional objects and advantages of the present invention will be readily apparent from the following detailed description of illustrative embodiments in conjunction with the drawings wherein:

FIGS. 1–9 are cross sectional views of a portion of an integrated circuit structure illustrating various successive stages in the fabrication of a semiconductor device in accordance with the invention having a plurality of circuit elements formed therein; and FIG. 10 is a plan view of FIG. 9, illustrating the spacing between elements which can be achieved in accordance with the method of the present invention.

Referring generally to the drawings and initially to FIG. 1, a substrate 10 of a preselected conductivity-type semiconductor material preferably comprises p-type silicon; an n-type semiconductor can also be utilized if desired. In this connection it should be noted that the conductivity-type mentioned herein may be readily reversed if desired, and are set forth purely for illustrative purposes. Conventional processing techniques can be utilized to suitably prepare the substrate 10 for fabrication of semiconductor devices. An insulating layer 12 of silicon dioxide, e.g., is provided on a surface of the substrate 10 using known techniques. For example, the dioxide layer 12 may be provided by thermal oxidation of an appropriately prepared surface of the substrate 10 at a temperature of approximately 1,000° C. for a time sufficient to provide a dioxide thickness of approximately 1,500–6,000 angstroms.

The layer 12 is masked and etched using conventional techniques to provide a plurality of apertures 14. The portions of the substrate 10 exposed by apertures 14 are doped by conventional techniques in order to form a plurality of opposite conductivity-type regions 16 at the surface of the semiconductor substrate 10, these regions 16 being commonly referred to in the art as buried layers and being shown in FIG. 2 as n+ regions. The buried layers 16 may be typically formed by diffusing an impurity such as antimony or arsenic into the surface of the semiconductor substrate 10 utilizing conventional techniques.

Figure 3:
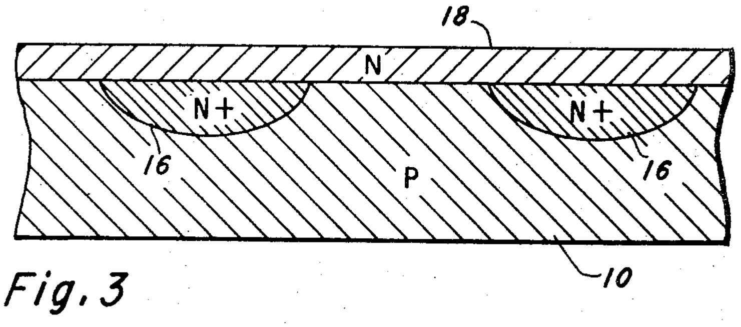

The remainder of the dioxide layer 12 is then removed as shown in FIG. 3 and an epitaxially deposited layer 18 is formed to cover substantially the entire surface of the substrate 10, including the buried layers 16 formed at the surface thereof. As shown, the epitaxial layer 18 is of an opposite conductivity-type with respect to the underlying semiconductor substrate 10, i.e., is of n-type material, and thus is of the same conductivity-type as the buried layers 16. Preferably, the epitaxial layer 18 is relatively thin in relation to the thickness of the semiconductor substrate 10 so as to aid in achieving the desired miniaturization of the ultimate device, and typically may have a thickness of between 2 to 4 microns.

Figure 4:
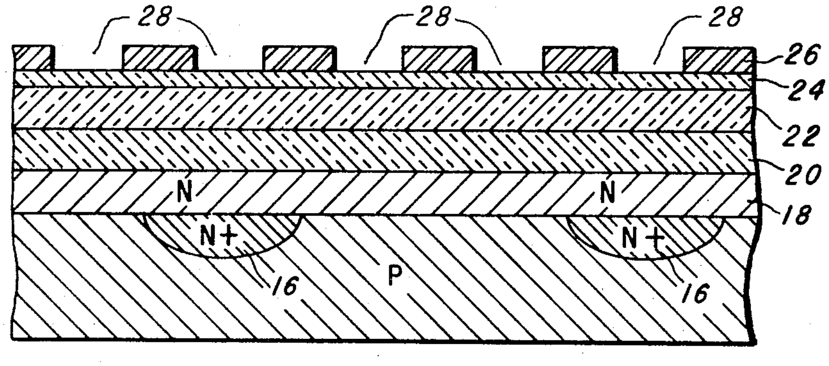

Referring now to FIG. 4, a first layer 20 of a preselected material is deposited on the exposed surface of the epitaxial layer 18. This first layer 20 comprises a material which functions to passivate the surface of the epitaxial layer 18, as well as serving to protect the epitaxial layer from reacting with subsequently deposited materials, which might produce undesired electrical characteristics. The layer 20 preferably comprises an insulator such as silicon dioxide, although various other material may be utilized in certain instances, if they fulfill the above-mentioned functions. The layer 20 may have a thickness of approximately 6,000 angstroms, although its exact thickness is not material, as long as it is sufficient to protect the underlying epitaxial layer 18 against undesired diffusion reactions during subsequent processing. The silicon dioxide layer 20 may be provided in a conventional manner by thermal oxidation of the surface of the epitaxial layer 18 in a suitable reactor at a temperature and for a time sufficient to produce a desired oxide thickness. A layer 22 is then deposited on the silicon dioxide layer 20; the layer 22 preferably comprises a material such as silicon nitride. The layer 22 must have different etch characteristics than the underlying layer 20, as will be apparent in the discussion of FIG. 6. The silicon nitride layer 22 may be deposited in the same reactor as the underlying silicon dioxide layer 20, if desired. In certain instances the silicon nitride layer may be replaced by other materials such as alumina, and various refractory metals such as molybdenum, tungsten, etc., although in the event conductive materials were utilized their removal would be required prior to effecting subsequent metallization operations.

In accordance with an important feature of the present invention the layer 24 is preferably formed to have a thickness no more than one-fifth as great as the thickness of either layer 20 or layer 22, and preferably having a thickness which is at least an order of magnitude less than either layer 20 or layer 22, and in one preferred embodiment has a thickness of approximately 300 angstroms. Since layer 24 is extremely thin, it is possible to form a desired pattern of apertures therein with an extremely high degree of resolution in which the spacing between adjacent apertures can be extremely small due to the thinness of the layer. A layer 26 of conventional photoresist can be utilized to define the apertures 28. In addition, since the layer 24 is relatively thin, a relatively short period of time is required for etching the apertures, thereby minimizing problems of photoresist lift or the like. As a result, it is possible to form a desired pattern of apertures 28 in the layer 24 utilizing conventional photolithographic techniques for exposing preselected regions in the underlying layer 22, which may be then selectively removed by etching or the like. Subsequently, the regions in the first oxide layer 20 which are exposed similarly may be removed to expose selected regions in the epitaxial layer 18 so that the requisite diffusion steps may be effected in order to form desired circuit elements. In this regard, for the sake of illustration, the process in accordance with the present invention will be subsequently described in conjunction with the formation of a transistor, a resistor, and isolation regions therebetween, although it should be noted that various other circuit elements and combinations thereof may be provided utilizing the techniques of the present invention, as described herein.

In proceeding with the process, conventional photolithographic techniques are utilized for depositing, selectively exposing, and etching a photoresist layer to define a mask pattern 26 (FIG. 4) of photoresist material, in which selected surface regions 28 of the underlying oxide layer 24 are exposed by apertures in the photoresist mask, while the remainder of the layer 24 is covered and is protected by the photoresist layer. The exposed regions 28 of the silicon dioxide layer 24 are then removed preferably by exposure to a selective etching procedure in which a preselected etchant is applied thereto which attacks the silicon dioxide material but does not substantially react with the protective photoresist mask 26. Typically, a solution of hydrofluoric acid may be utilized in this regard. Since the layer 24 is relatively thin, the etching may be accomplished relatively rapidly and in certain instances may only require one or two minutes, thereby minimizing problems of undercutting and photoresist lift and maximizing the accuracy of the etching procedure. The exposed regions 28 correspond to all of the regions of the underlying substrate 10 wherein doping is required. As will be explained in more detail below, a first set of doped regions corresponding to a first set of regions 28 is effected during one step, while a second set of doped regions corresponding to a second set of regions 28 is effected at a subsequent time.

Figure 5:
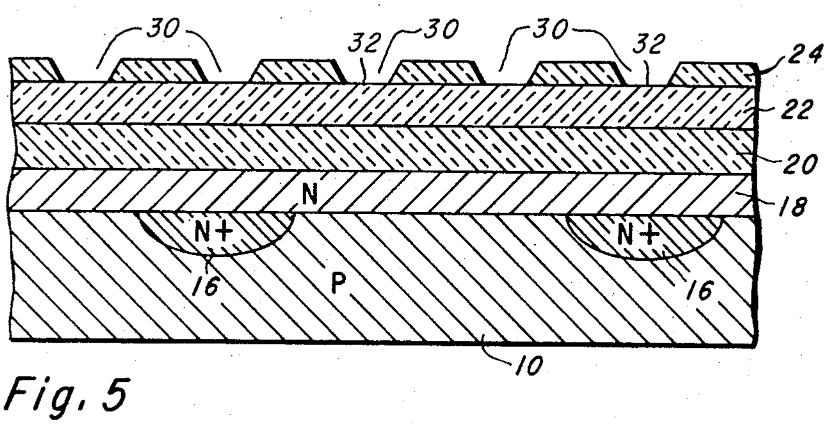

Referring now to FIG. 5, the layer 24 is illustrated having a plurality of apertures 30 therein located at the previously exposed regions 28 which were not covered by the photoresist layer 26. The apertures 30 are defined in an extremely precise spatial relationship with respect to each other due to the high resolution achieved in forming this pattern of apertures in the relatively thin layer 24. These apertures expose the first portion of a subsequently formed composite mask, as will be explained hereinafter, for use in forming isolation regions, the base and collector regions of a transistor and a resistor. In this regard it should be noted that all of these regions are defined by and spaced from each other with a single mask so that critical spatial alignments, as well as aperture sizes, may be incorporated into a relatively precisely defined, single mask pattern. The apertured layer 24 is then employed as an etchant mask in the selective removal of portions of the silicon nitride intermediate layer 22, defined by surface regions 32 exposed by the apertures 30. In this connection a preselected etchant is applied which attacks silicon nitride at a substantially faster rate than it reacts with silicon dioxide so as to effect the removal of the portions of the silicon nitride layer 22 generally defined by the surface regions 32.

Figure 6:
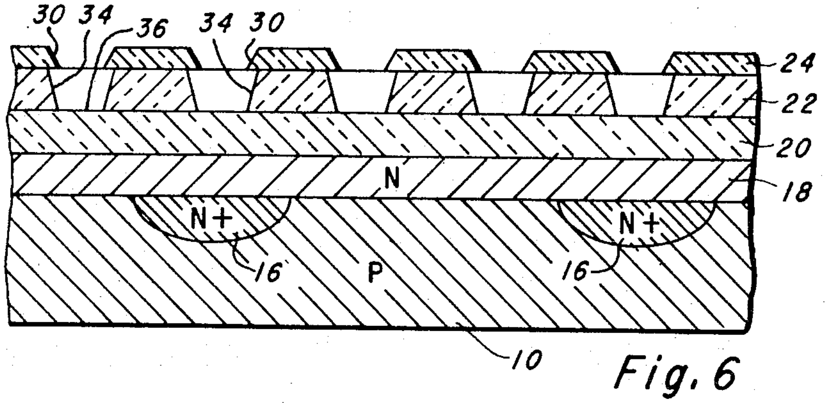

Accordingly, referring to FIG. 6, a plurality of apertures 34 are formed in the silicon nitride layer 22 generally in registration with the apertures 30 in the overlying silicon dioxide layer 24. One example of a suitable selective etchant that attacks silicon nitride at a substantially faster rate than it reacts with silicon dioxide comprises phosphoric acid which may be utilized in this regard. In addition, as may be seen in FIG. 6, during formation of the apertures 34, a certain amount of undercutting occurs, whereby the upper portion of the aperture is of a slightly larger size than the lower portion and extends slightly beneath the covering defined by the overlying silicon dioxide layer 24. This occurs because part of the aperture is in contact with the etchant for a longer period of time as the etchant proceeds through the material. However, this amount of undercutting is generally immaterial since the critical spatial alignment between various of the regions is maintained due to the precise pattern defined in the relatively thin silicon dioxide outer layer 24.

Since the desired pattern is now defined in the intermediate silicon nitride layer 22, the outer layer 24 of silicon dioxide may be removed. The silicon nitride layer 22 serves as an etch mask for selective removal of the underlying oxide layer 20; this removal of oxide layer 20 is followed by removal of the silicon nitride layer 22. Apertures 34 in layer 22 enable formation of apertures 51 in layer 20.

Accordingly, referring to FIG. 7, a composite mask has now been formed in layer 20 wherein precisely spaced apertures 51 correspond to each region of the substrate 10 wherein doping is required. An important feature of the invention is the fact that all of the apertures are defined in a precise pattern in a single masking layer 20. Another layer of silicon nitride 23 is next formed over layer 20 and regions of the epitaxial layer 18 exposed by apertures 51. A layer of silicon dioxide 25 is formed over the silicon nitride layer 23. This provides adhesion for subsequent photoresist operations. Layer 25 may conveniently be formed by converting a portion of silicon nitride layer 23 to silicon dioxide. The thickness of the converted layer should be substantially less than the thickness of either of layers 20 or 22.

Referring to FIG. 8, an oversize mask is used to expose apertures 41 in photoresist layer 39 to select areas for removal of layers 23 and 25 for an impurity diffusion (p+ isolation in the case shown). Apertures 41 can advantageously be much larger than apertures 51 in layer 20, and thus critical alignment is not required. Layer 25 is removed by exposure to an etchant which attacks silicon dioxide at a substantially faster rate than it reacts with silicon nitride. Layer 23 (silicon nitride) is then removed from aperture 41 by exposure to phosphoric acid. Consequently, a composite mask generally indicated by the reference numeral 40 comprises the first silicon dioxide layer 20 having apertures 51, and the overlying silicon nitride layer 23 (having a preselected pattern of apertures 41 which expose only selected surface regions 42 in the underlying epitaxial layer 18 through a first set of apertures 51 in layer 20). This composite mask 40 may be utilized as a diffusion mask so that suitable conductivity-type determining impurities may be introduced into exposed regions 42 of the epitaxial layer 18 in order to form desired circuit elements. In addition, it should be noted that the relative alignment of the various surface regions 42 which are in registration with the respective apertures 51 in the overlying mask 20 are precisely spaced with respect to each other so that the single composite mask may be utilized in effecting a number of diffusion operations in forming a plurality of circuit elements which are similarly in a precise spatial relationship with respect to each other.

Typically, in fabricating an integrated circuit, an initial diffusion step is effected for forming a plurality of isolation regions 44, which in the illustrating embodiment comprises p+ regions, in order to establish the requisite electrical isolation between various regions of the epitaxial layer 18. The location of the p+ isolation regions 44 is relatively significant since they must be arranged in intermediate selected regions in the epitaxial layer 18 in order to provide electrical isolation between closely spaced circuit elements which are subsequently formed in the epitaxial layer. Since the composite mask 40 provides for the requisite spacing between the various regions this critical spacing is conveniently accomplished in view of the fact that the composite mask 40 has been patterned by a high resolution procedure as previously explained. The p+ isolation regions 44 may be provided in a conventional manner by diffusion suitable conductivity-type determining impurities in a gaseous atmosphere at an elevated temperature into the apertures which are defined by the regions 44 while suitable masking other exposed apertures with the silicon nitride layer 23 to prevent diffusion into these areas. For example, a gaseous atmosphere containing an impurity, such as boron, may be employed for effecting the formation of the p+ isolation regions 44. Typically, during such a diffusion operation, an oxide layer 45 reforms overlying the p+ region 44 and may occupy the apertures in the layers 20 and 23 which are in registration with and expose the regions 44.

Thus, referring to FIG. 8 it may be seen that the apertures in the silicon dioxide layer 20 and in the silicon nitride layer 23 which previously exposed the regions 44 are occupied by regrown oxide material 45 subsequent to diffusion. In a manner as above described, other surface regions 42 of the epitaxial layer 18 may be selectively exposed through other sets of apertures 51 in layer 20 to enable the diffusion of conductivity-type determining impurities in order to form the regions of the desired circuit elements in the epitaxial layer utilizing conventional photolithographic masking techniques in which various selected areas are masked while diffusion is effected into exposed regions. However, it should be noted that the relative spacing and alignment of the various regions is provided by the composite mask 40.

With reference to FIG. 9, a p-type region 46, which defines the base of a subsequently defined transistor, is provided in the epitaxial layer 18, and simultaneously therewith another p-type region 48, which is spaced therefrom may be provided in the epitaxial layer for defining a resistor region. Similarly, an n+ region 50 may be provided in a portion of the area defined by the base region 46 to define the emitter portion of the transistor structure utilizng conventional photolithographic techniques. The emitter diffusion is not defined by the composite mask 40, but must be aligned conventionally to the base. Another n+ region 52 may be formed at another spaced location defined by the composite mask 40 to define the collector region of the transistor structure. Thus, the spacing between the collector region 52 and the base region 46 is defined by the composite mask 40 so that the critical spacing between these regions of the transistor structure is maintained with a high degree of accuracy. Conventional diffusion techniques may be employed in conventional reactors in forming the various conductivity-type regions. For example, a gaseous atmosphere including antimony or arsenic may be utilized in forming the n+ emitter and collector regions, while a gaseous atmosphere including boron may be utilized in forming the p-type base region.

As further illustrated in FIG. 9, upon completion of the formation of the various regions of the transistor structure and of the resistor structure, a pattern of conductive contacts or metallization may be deposited in various ways utilizing conventional techniques. The various details in conjunction with the formation of the contact areas are not described in detail in that these procedures are well known in the art. However, it should be noted that during the diffusion operations for forming the various transistor regions and the base region it is preferable that additional oxide not be formed in the apertures exposing these regions until the contacts have been formed; except that region 46, which defines the base, is oxidized during the interval when the resistor region 48 is being formed after resistor formation layer 23 is removed. Thus, the requisite contacts may be conveniently established to these regions through the apertures defined in the composite mask 40. In forming the emitter contact it is merely necessary to form an aperture in the oxide overlying the emitter region 50 for forming the contact to the emitter region. Accordingly, this is the only region which must be relatively carefully sized and aligned with respect to other regions. In establishing the contact pattern, a contact 54 may be conveniently formed through the apertures in the composite mask 40 to the base region 46. Similarly, a contact 56 may be formed to the collector region 52 while a contact 58 is established with the emitter region 50 utilizing suitable photolithographic techniques for making an aperture in the oxide layer overlying the emitter region 50. To complete the metallization suitable contacts 60 and 62 are made to opposite ends of the resistor region 48 as shown in FIG. 9. If desired, suitable interconnections between the various metallic contacts may be effected, although for simplicity of illustrations such interconnections are not shown in detail.

Referring to FIG. 10, the spacing between the various regions and contacts of the circuit in FIG. 9 is illustrated in plan view to further demonstrate the simplicity with which critical spatial relationships between various regions is achieved in accordance with the present invention. As shown, the base region 46 is spaced from the collector region 52 by a predetermined distance which is relatively easily and conveniently maintained since this spacing is maintained by the pattern of the composite mask 40. The contact 54 to the base region 46 is conveniently formed in the base region 46. The contact 56 to the collector region 52 is formed through the previously provided aperture in the composite mask. Similarly, the formation of the contacts 60, 62 to the resistor region 48 are conveniently achieved through the previously defined apertures in the composite mask 40. Thus, these contacts are made with minimal additional mask alignment procedures, which substantially enhances the efficiency of the process, although the contact 58 to the emitter region 50 is separately effected. The metallization utilized in forming the contacts may comprise various metals such as platinum, aluminum, etc. In addition, it should be noted that if over etching should occur during the formation of the resistor 46 so that a portion of the epitaxial region beyond the resistor region 48 is exposed to metallization, a short circuit is not established. Instead, a Schottky diode is formed, rather than a short circuit, and in this situation such a diode generally has no adverse effect on circuit operation. Thus, the resistor contacts 60 and 62 may be conveniently established with the possibility to error due to misalignment being substantially precluded.

Accordingly, a unique processing technique has been described in detail for forming a composite diffusion mask in which a number of critical spatial alignments are achieved in a simplified and accurate fashion so as to provide a improved method for use in fabricating semiconductor devices, such as integrated circuits. Further, it will be appreciated that problems relating to misalignment problems, undercutting, etc. which are experienced in conventional techniques have been substantially eliminated.

Various changes and modifications in the above-described procedures will be readily apparent to those skilled in the art and any of such changes or modifications are deemed to be within the spirit and scope of the present invention.

What is claimed is:

1. In a method for fabricating a semiconductor device, the steps comprising:

forming a first layer comprising silicon dioxide on a surface of a body of silicon semiconductor material;

forming a preselected pattern of openings in said first layer to expose preselected regions of said silicon material, said exposed portions being precisely spaced with respect to one another to define a composite diffusion mask;

forming a second layer comprising silicon nitride on said exposed silicon regions and on said composite diffusion mask;

forming a first preselected pattern of openings in said second layer in registry with a first set of said openings in said first layer;

doping the preselected regions at the surface of said body of semiconductor materials exposed by said first set of openings in said first layer with conductivity-type-determining impurities to form regions of preselected conductivity-type in the body of semiconductor material;

forming a third layer comprising silicon nitride over the resultant structure;

patterning said third layer to define a second preselected pattern of openings corresponding with a second set of said openings in said first layer;

removing portions of said second layer exposed by said second pattern of openings, thereby exposing a second set of locations at the surface of said substrate; and doping said second set of locations with conductivity-type-determining impurities.

2. A method as in claim 1 wherein said device is an integrated circuit, wherein the first doping step forms isolation regions, and wherein the second doping step forms transistor base regions.

3. A method for selectively exposing accurately spaced surface regions of a semiconductor substrate as set forth in claim 1 wherein the step of forming said third layer is characterized by converting a portion of said second layer to silicon dioxide having a thickness substantially less than either said first layer or said second layer, thereby enabling increased geometric resolution during the step of forming said openings in said third layer.

4. A method in accordance with claim 1 wherein the step of forming said third layer is characterized by controlling the thickness thereof to be at least five times less than either said first silicon dioxide layer or said silicon nitride layer.

5. A method for selectively exposing accurately spaced surface regions of a semiconductor substrate as set forth in claim 1 wherein the steps of patterning said silicon nitride layers are characterized by selectively etching apertures therethrough, said apertures being substantially larger than the respective corresponding apertures through said first layer, and in general alignment therewith, whereby alignment tolerances in patterning said nitride layers are materially reduced.

6. In a method for fabricating a semiconductor device, the steps comprising:

a. forming a first layer comprising silicon dioxide on a surface of a body of silicon semiconductor material;

b. forming a preselected pattern of openings in said first layer through a mask to expose preselected regions of said silicon material, said exposed portions being precisely spaced with respect to one another to define a composite diffusion mask;

c. forming a second layer comprising silicon nitride on said exposed silicon regions and composite diffusion mask;

d. forming a third layer comprising silicon dioxide on said silicon nitride layer;

e. forming a first preselected pattern of openings in said third layer to expose preselected regions of said silicon nitride layer whereby said third layer defines an etchant mask, said exposed preselected regions of said silicon nitride layer being formed in registry with a first set of said openings in said first layer;

f. removing said exposed regions of said silicon nitride layer to define apertures therethrough, said apertured second layer defining a diffusion mask;

g. doping the preselected regions at the surface of the body of semiconductor material exposed by said apertures in said second layer with conductivity-type determining impurities to form regions of preselected conductivity-type in the body of semiconductor material;

h. forming a fourth layer comprising silicon nitride over the resultant structure;

i. forming a fifth layer comprising silicon dioxide over said fourth layer;

j. patterning said fifth layer to define a second preselected pattern of openings corresponding with a second set of said openings in said first layer;

k. removing portions of said fourth layer exposed by said second pattern of openings, thereby exposing a second set of locations at the surface of said substrate; and l. doping said second set of locations with impurities.

7. A method in accordance with claim 6 wherein said third layer is approximately one order of magnitude thinner than either said first layer or said second layer.

8. A method in accordance with claim 7 wherein said exposed portions of said silicon nitride layer are removed by exposing said etchant mask to a preselected etchant which reacts with silicon nitride at a substantially faster rate than it reacts with silicon dioxide.

* * * * *